United States Patent
Peng et al.

(10) Patent No.: US 9,728,461 B2
(45) Date of Patent: Aug. 8, 2017

(54) METHOD OF FORMING SEMICONDUCTOR DEVICE WITH DIFFERENT THRESHOLD VOLTAGES

(71) Applicant: Taiwan Semiconductor Manufacturing Company, Ltd., Hsin-Chu (TW)

(72) Inventors: Cheng-Yi Peng, Taipei (TW); Chia-Cheng Ho, Hsin-Chu (TW); Chih Chieh Yeh, Taipei (TW); Tsung-Lin Lee, Hsinchu (TW); Yu-Lin Yang, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/839,753

(22) Filed: Aug. 28, 2015

(65) Prior Publication Data

US 2016/0172248 A1  Jun. 16, 2016

Related U.S. Application Data

(63) Continuation-in-part of application No. 14/569,096, filed on Dec. 12, 2014.

(51) Int. Cl.
*H01L 21/8234* (2006.01)
*H01L 21/8238* (2006.01)
*H01L 21/324* (2006.01)

(52) U.S. Cl.
CPC ...... *H01L 21/82345* (2013.01); *H01L 21/324* (2013.01); *H01L 21/823412* (2013.01);
(Continued)

(58) Field of Classification Search
None
See application file for complete search history.

(56) References Cited

U.S. PATENT DOCUMENTS 6,274,490 B1 *  8/2001  Chyan ............... H01L 21/28176
257/565
7,262,104 B1  8/2007  Wang et al.
(Continued)

OTHER PUBLICATIONS

U.S. Appl. No. 14/529,944, filed Oct. 31, 2014, by inventors Chia-Cheng Ho, Cheng-Yi Peng, Chih Chieh Yeh, Tsung-Lin Lee, and Jung-Piao Chiu for "Method of Forming Semiconductor Device with Different Threshold Voltages," 21 pages of text, 16 pages of drawings.

*Primary Examiner* — Asok K Sarkar
(74) *Attorney, Agent, or Firm* — Haynes and Boone, LLP

(57) ABSTRACT

A method for fabricating a semiconductor device includes forming a first gate stack over a first fin feature and second gate stack over a second fin feature, removing the first gate stack to form a first gate trench that exposes the first fin structure, removing the second gate stack to form a second gate trench that exposes the second fin feature, performing a high-pressure-anneal process to a portion of the first fin feature and forming a first high-k/metal gate (HK/MG) within the first gate trench over the portion of the first fin feature and a second HK/MG within the second gate trench over the second fin feature. Therefore the first HK/MG is formed with a first threshold voltage and the second HK/MG is formed with a second threshold voltage, which is different than the first threshold voltage.

20 Claims, 13 Drawing Sheets

(52) U.S. Cl.
CPC ........... *H01L 21/823431* (2013.01); *H01L 21/823807* (2013.01); *H01L 21/823821* (2013.01); *H01L 21/823462* (2013.01)

(56) References Cited

U.S. PATENT DOCUMENTS

| | | |
|---|---|---|
| 7,425,740 B2 | 9/2008 | Liu et al. |
| 8,048,723 B2 | 11/2011 | Chang et al. |
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2002/0031920 A1* | 3/2002 | Lyding ............. H01L 21/28176 438/795 |
| 2013/0285153 A1 | 10/2013 | Lee et al. |
| 2014/0183600 A1 | 7/2014 | Huang et al. |
| 2014/0227850 A1 | 8/2014 | Zhang et al. |
| 2014/0264590 A1 | 9/2014 | Yu et al. |
| 2014/0264592 A1 | 9/2014 | Oxland et al. |
| 2015/0255463 A1* | 9/2015 | Ando ............. H01L 29/66545 257/371 |
| 2015/0325683 A1* | 11/2015 | Cho ............. H01L 29/66537 438/283 |
| 2016/0351452 A1* | 12/2016 | Ando ............. H01L 21/32133 |

\* cited by examiner

METHOD OF FORMING SEMICONDUCTOR DEVICE WITH DIFFERENT THRESHOLD VOLTAGES

This application is a continuation-in-part of U.S. application Ser. No. 14/569,096, filed on Dec. 12, 2014, entitled "Method of Forming Semiconductor Device with Different Threshold Voltages", which is hereby incorporated by reference in its entirety.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, challenges rise to develop robust formation processes for forming different threshold voltages.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
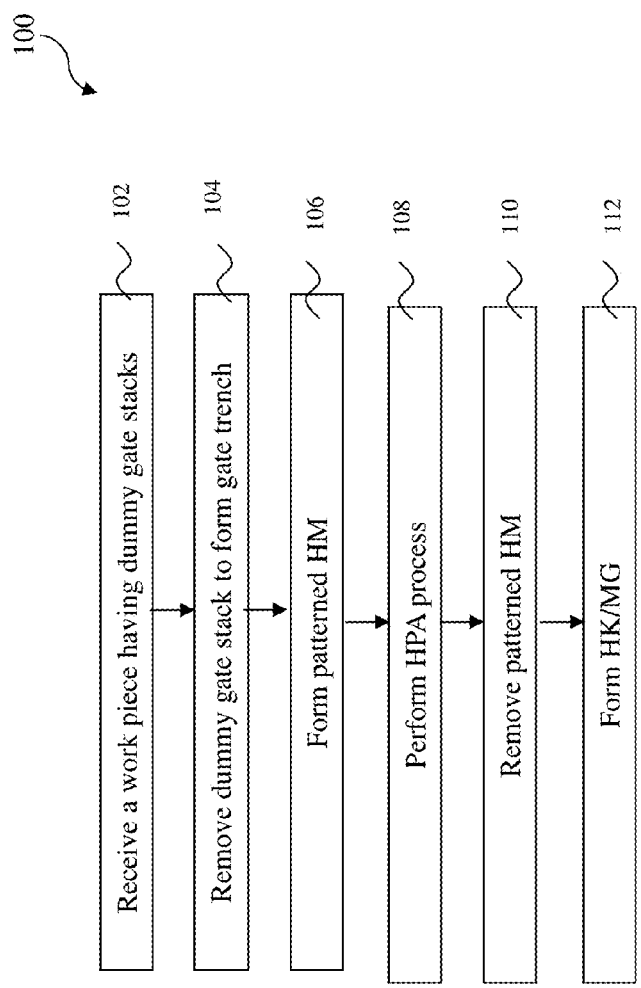
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 of fabricating one or more semiconductor devices in accordance with some embodiments. The method 100 is discussed in detail below, with reference to a work piece of a semiconductor device 200 shown in FIGS. 2A and 2B, and the semiconductor device 200 shown in FIGS. 3, 4, 5, 6 and 7.

Figure 2A:
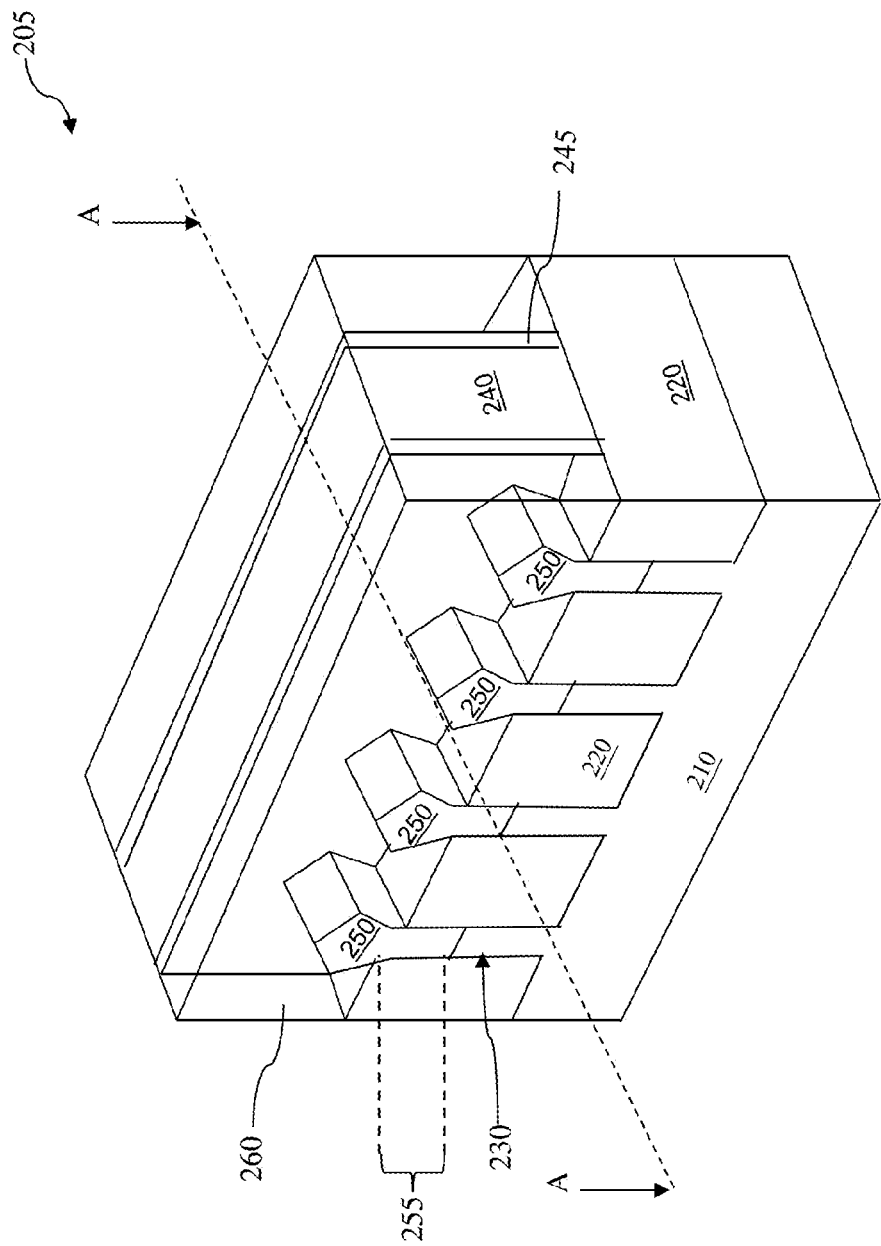
FIG. 2A is a diagrammatic perspective view of an example of a work piece of a semiconductor device in accordance with some embodiments.
Figure 2B:
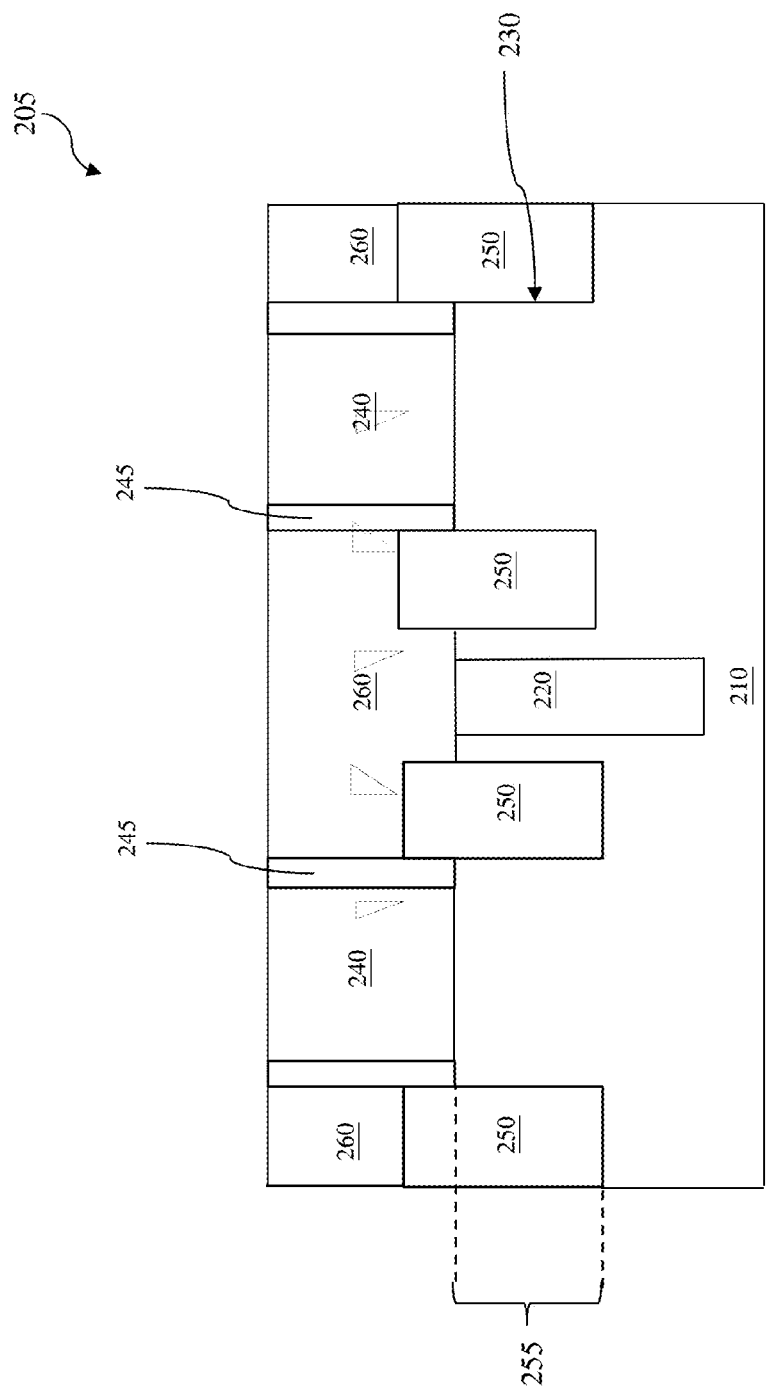
FIG. 2B is a cross-sectional view of an example of a work piece of a semiconductor device along the line A-A in FIG. 2A.

Referring to FIGS. 1, 2A and 2B, the method 100 begins at step 102 by receiving a work piece 205 of the semiconductor device 200. The work piece 205 includes a substrate 210. The substrate 210 may be a bulk silicon substrate. Alternatively, the substrate 210 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The work piece 205 also includes a plurality of fin features 230 formed over the substrate 210. The fin feature 230 may include Si, SiGe, SiGeSn, GaAs, InAs, InP, and/or other suitable materials. In some embodiments, the fin feature 230 is formed by any suitable process including various deposition, photolithography, and/or etching processes. As an example, the fin 230 is formed by patterning and etching a portion of the substrate 210.

The work piece 205 also includes a plurality of gate stacks 240 over the substrate 210, including wrapping over a portion of the fin features 230. In the present embodiment, the gate stack 240 is a dummy gate stack, which will be replaced later by high-k/metal gate (HK/MG). The dummy gate stack 240 may include a dielectric layer, a polysilicon layer. The dummy gate stack 240 may be formed by any suitable process or processes, such as deposition, patterning and etching.

Sidewall spacers 245 are formed along the sidewalls of the dummy gate stack 240. The sidewall spacers 245 may include a dielectric material such as silicon oxide. Alternatively, the sidewall spacers 245 may include silicon nitride, silicon carbide, silicon oxynitride, or combinations thereof. The sidewall spacers 245 may be formed by depositing a gate sidewall spacer layer and then anisotropic dry etching the gate sidewall spacer layer, known in the art.

The work piece 205 also includes source/drain (S/D) features 250 over the substrate 210, beside the gate stack 240 (with the sidewall spacers 245). In some embodiments, the source/drain feature 250 is a source feature, and another source/drain feature 250 is a drain feature. The source/drain features 250 are separated by the dummy gate stack 240. In one embodiment, a portion of the fin feature 230, beside the dummy gate stack 240 is recessed to form S/D recesses 255 and then the S/D features 250 are formed over the S/D recesses 255 by epitaxial growing processes, including chemical vapor deposition (CVD) deposition techniques (e.g., vapor-phase epitaxy (VPE) and/or ultra-high vacuum CVD (UHV-CVD)), molecular beam epitaxy, and/or other suitable processes. The S/D features 250 may include Ge, Si, GaAs, aluminum gallium arsenide (AlGaAs), SiGe, gallium arsenide phosphide (GaAsP), GaSb, InSb, indium gallium arsenide (InGaAs), InAs, or other suitable materials. After the S/D recesses 255 are filled with the S/D feature 250, further epitaxial growth of a top layer of the S/D features 250 expands horizontally and facets may start to form, such as a diamond shape facets. The S/D features 250 may be in-situ doped during the epi processes. For example, in one embodiment, the S/D feature 250 includes an epitaxially grown SiGe layer that is doped with boron. In another embodiment, the S/D feature 250 includes an epitaxially grown Si epi layer that is doped with carbon. In yet another embodiment, the S/D feature 250 includes an epitaxially grown Si epi layer that is doped with phosphorous. In one embodiment, the S/D feature 250 is not in-situ doped, an implantation process (i.e., a junction implant process) is performed to dope the S/D feature 250. One or more annealing processes may be performed to activate dopants. The annealing processes comprise rapid thermal annealing (RTA) and/or laser annealing processes.

The work piece 205 also includes an interlayer dielectric (ILD) layer 260 deposited over the substrate 210, including between/over each of the dummy gate stack 240 and over the S/D features 250. The ILD layer 260 may be deposited by CVD, atomic layer deposition (ALD), spin-on coating, or other suitable techniques. The ILD layer 260 may include silicon oxide, silicon nitride, oxynitride, a dielectric material having a dielectric constant (k) lower than thermal silicon oxide (therefore referred to as low-k dielectric material layer), and/or other suitable dielectric material layer. The ILD layer 260 may include a single layer or multiple layers. A CMP may be performed to polish back the ILD layer 260 to expose a top surface of the dummy gate stack 240.

Figure 3:
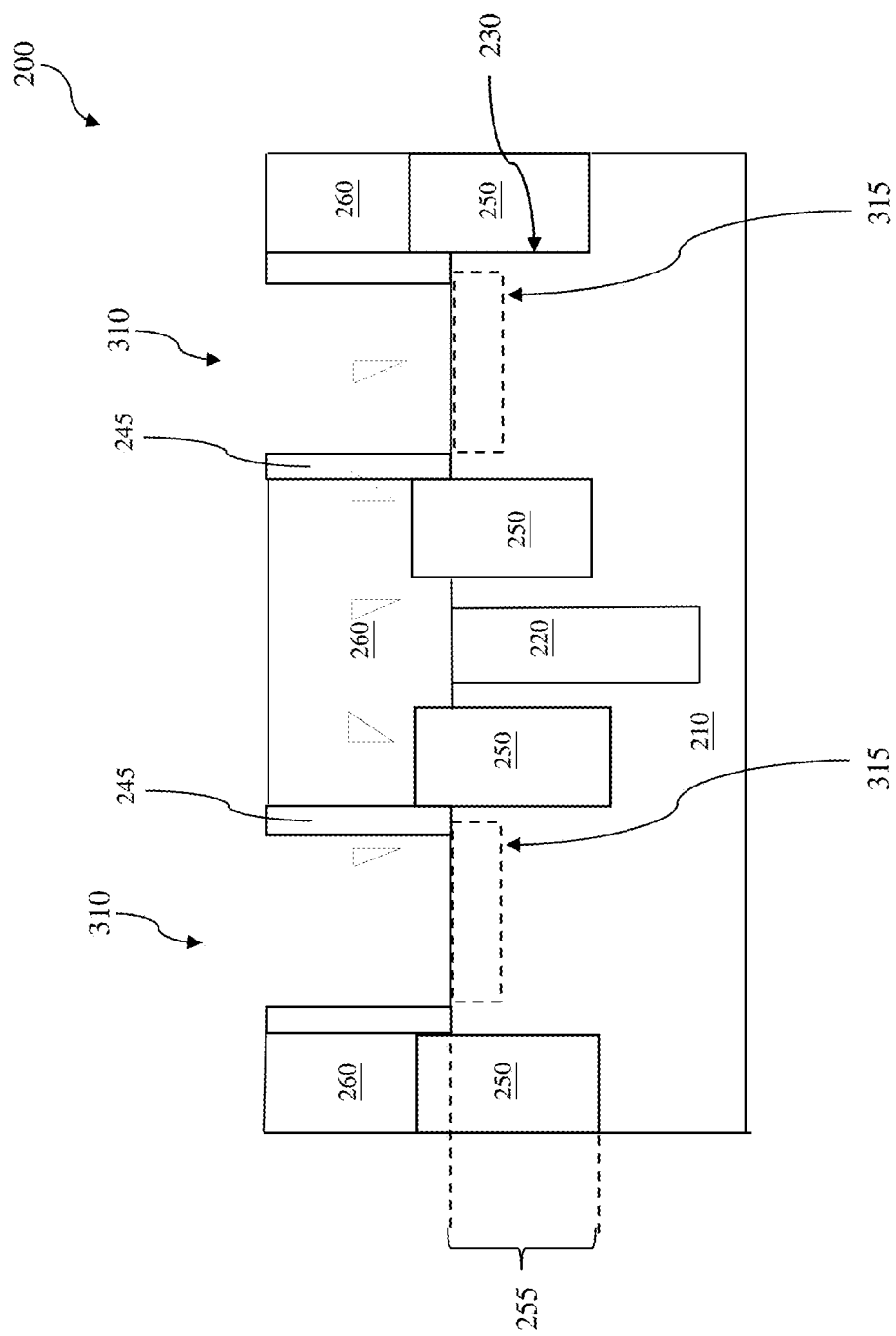
FIGS. 3, 4, 5, 6 and 7 are cross-sectional views of an example semiconductor device in accordance with some embodiments, along the line A-A in FIG. 2A.

Referring to FIGS. 1 and 3, the method of 100 proceeds to step 104 by removing the dummy gate stacks 240 to form gate trenches 310. The etching processes may include selective wet etch or selective dry etch, such that having an adequate etch selectivity with respect to the fin feature 230, the sidewall spacer 245 and the ILD layer 260. Alternatively, the dummy gate stacks 240 may be removed by a series of processes including photolithography patterning and etching back. In the present embodiment, a portion of the fin features 230 is exposed in the gate trenches 310, where a gate channel is to be formed and therefore it is referred to as a channel region 315.

Figure 4:
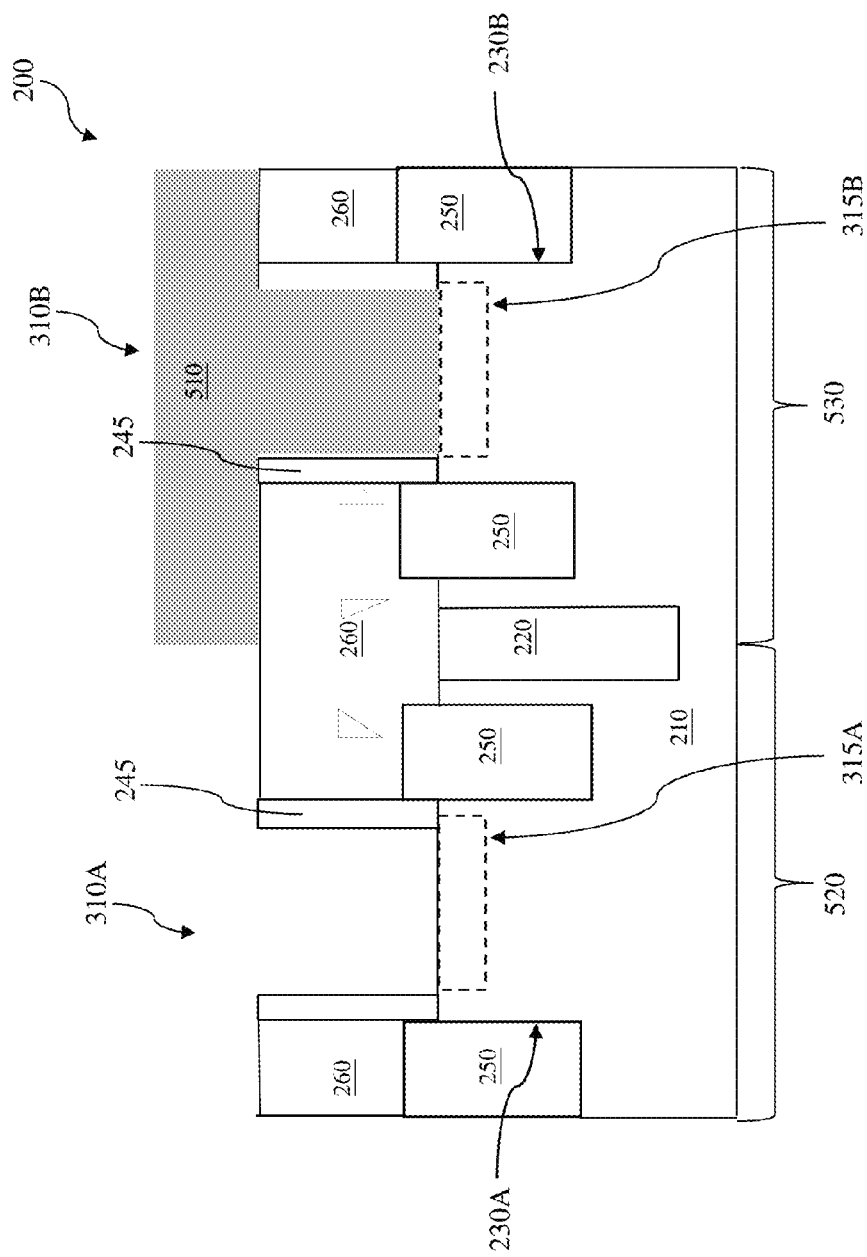

Referring to FIGS. 1 and 4, the method 100 proceeds to step 106 by forming a patterned hard mask (HM) 510 to define a first region 520 and a second region 530 over the substrate 210. It is often desirable to be able to make semiconductor device with different threshold voltages (Vt). For example, the first region 520 is a low-power portion (having high $V_{th}$) and the second region 530 is a high-speed portion (having low $V_{th}$). For another example, the first region 520 is an n-type FinFET (NFET) region and the second region 530 is a p-type FinFET (PFET) region. Therefore a first HK/MG gate to be formed in the NFET region 520 may need to have a different gate threshold voltage (Vt) from a second HK/MG gate to be formed in the PFET region 530. In the present embodiment, the patterned HM 510 covers the second region 530, including covering the second fin feature 230B in the second gate trench 310B, and leave the first region 520 uncovered. The patterned HM 510 may include silicon nitride, silicon carbide, silicon carbide nitride, and/or other suitable material. It should be understood that in other embodiments the first region 520 is a p-type FinFET (NFET) region and the second region 530 is an n-type FinFET (PFET) region.

In some embodiments, the patterned HM 510 is formed by depositing a HM layer over both of the first region 530 and the second region 530 first. The material of the HM layer is chosen to be different from the material of the fin feature 230, the sidewall spacers 245 and the ILD layer 260 to achieve etching selectivity during a subsequent etch. The HM layer may be deposited by CVD, ALD, or other suitable techniques. A patterned photoresist layer is formed over the HM layer by a lithography process and the HM layer is then etched through the patterned photoresist layer. The etching process selectively etches HM layer without substantially etching the fin feature 230, the sidewall spacers 245 and the ILD layer 260. The selective etch may include a selective wet etch, a selective dry etch, and/or a combination thereof.

For the sake of clarity, the gate trench 310, the fin feature 230 and the channel region 315 in the first region 520 is referred to as a first gate trench 310A, the first fin feature 230A and the first channel region 315A, respectively, and the gate trench 310, the fin feature 230 and the channel region 315 in the second region 530 is referred to as a second gate trench 310B, the second fin feature 230B and the second channel region 315B, respectively. Being uncovered by the patterned HM 510, the first channel region 315A in the first gate trench 310A is exposed.

Figure 5:
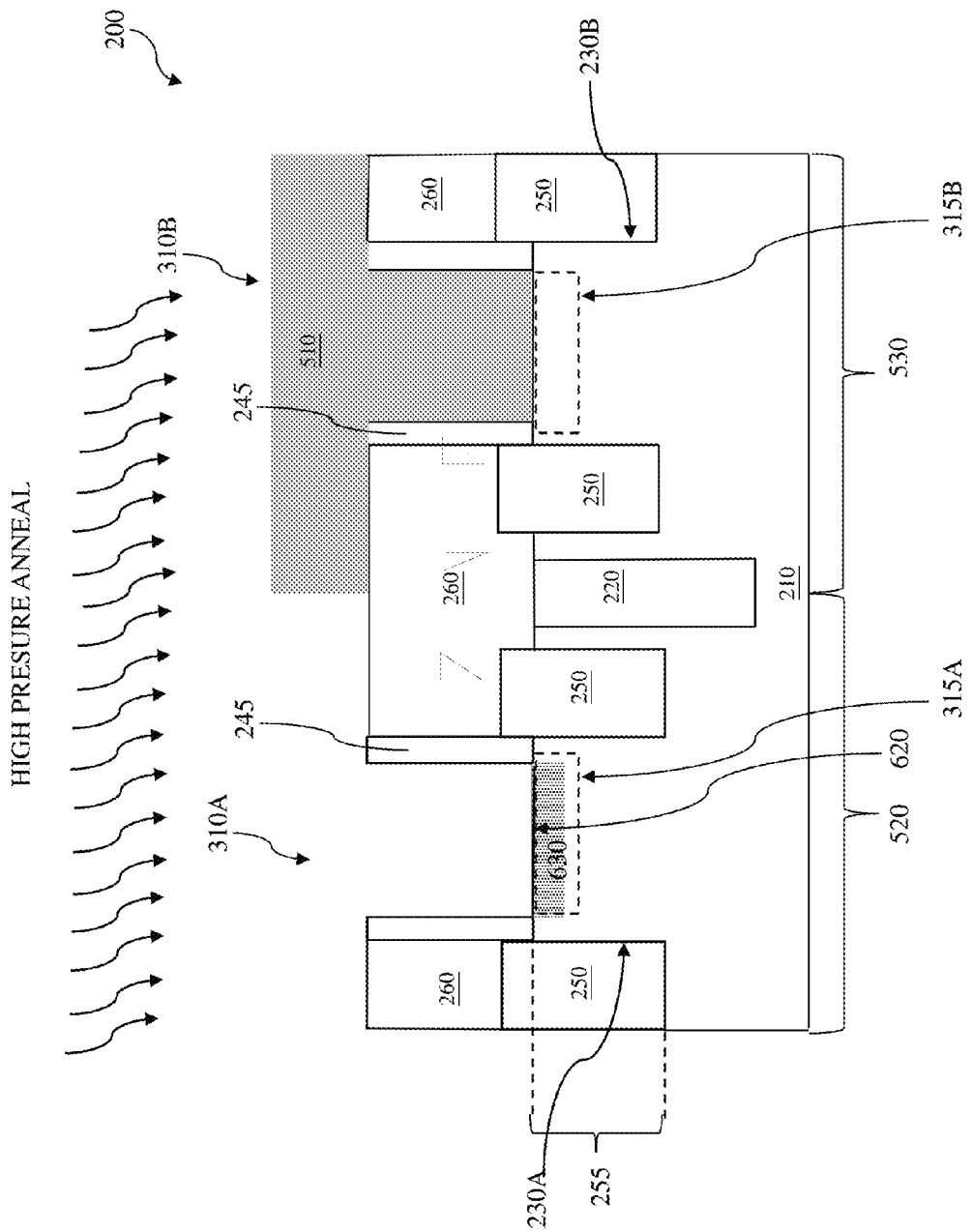

Referring to FIGS. 1 and 5, the method 100 proceeds to step 108 by performing a high-pressure-annealing (HPA) process to the first channel region 315A. In the present embodiment, the channel region 315A is in different environments from the channel region 315B. Particularly, the first channel region 315A is uncovered by the patterned HM 510 while the second channel region 315B is covered by the patterned HM 510. With the differentiated conditions to the first and second channel regions, 315A and 315B, the HPA process induces material property changes in the first channel region 315A while the second channel region 315B remains unchanged. The changing of the material property of the first channel region 315A experiences a self-alignment nature, which improves process control window.

In the present embodiment, the HPA process is conducted in non-oxygen ambient to avoid oxidation and changing composition of the first fin feature 230A, such as converting a semiconductor material to a semiconductor oxide material. Sometimes, after changing material composition, shapes and dimension of fin features may vary from one fin feature to another fin feature, and/or vary from an upper portion to a lower portion of a same fin feature, referred to as non-uniform fin feature, which may alter device performance adversely. The HPA process is conducted with a pressure in a range from 10 atm to 30 atm and a temperature in a range from 27° C. to 600° C. and process gases such as hydrogen ($H_2$), deuterium ($D_2$), chlorine ($Cl_2$) and carbon tetrafluoride ($CF_4$), and/or other suitable gas.

During the HPA process, material properties of the semiconductor material in an upper portion (adjacent to a surface 620) of the first channel region 315A, such as interface defect density (Dit) and fixed charges, change to different material properties than the material properties in the second channel region 315B. In an embodiment, fixed charges and Dit are reduced in the first channel region 315A comparing to the second channel region 315B. For the sake of clarity, the semiconductor material in the first channel region 315A is referred to as a modified semiconductor material 630.

Figure 6:
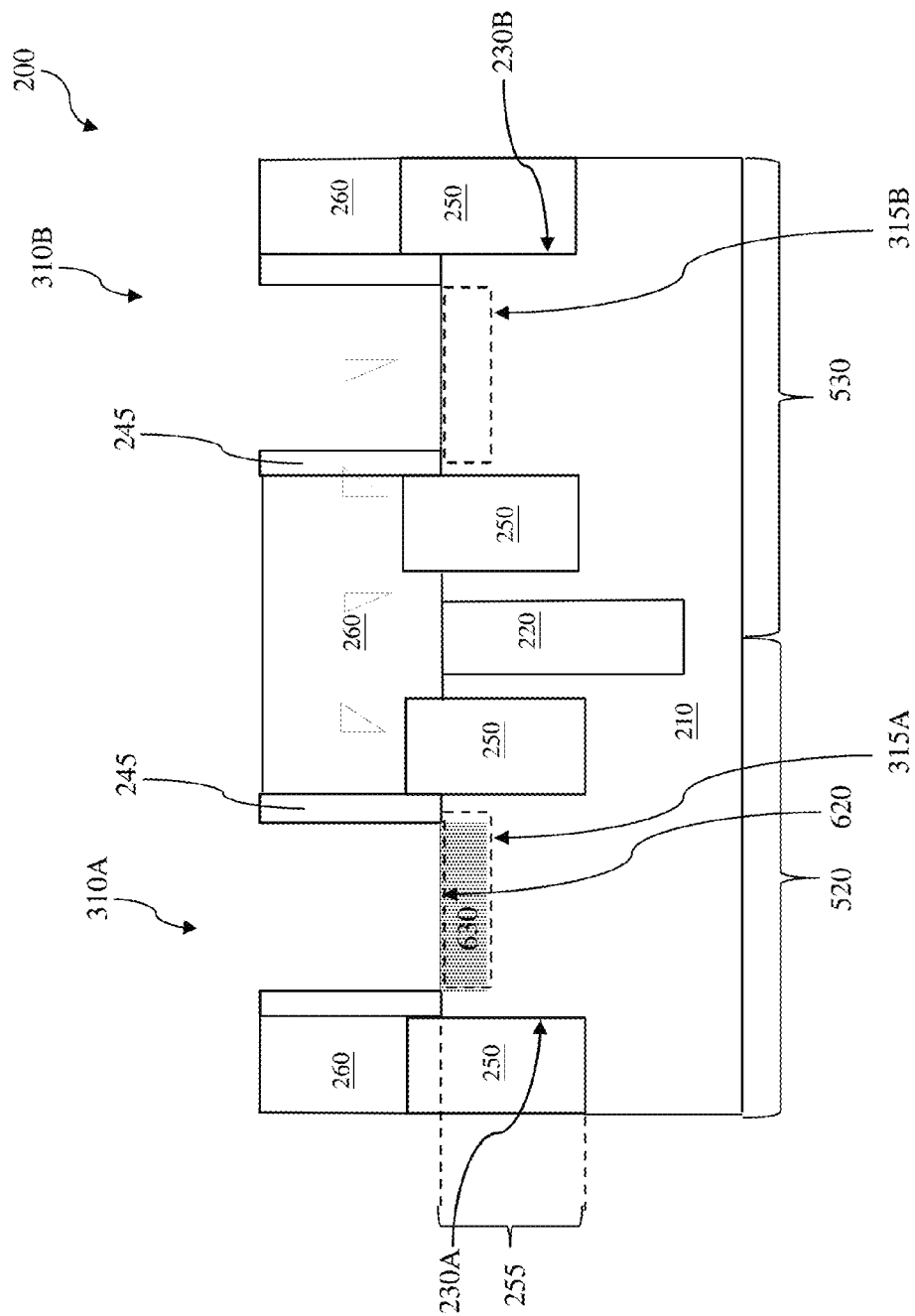

Referring to FIGS. 1 and 6, the method 100 proceeds to step 110 by removing the patterned HM 510. The etching process may include wet etch, dry etch, and/or a combination thereof. In some embodiments, the etching process selectively etches HM layer without substantially etching the first and second fin features 230A and 230B, the sidewall spacers 245 and the ILD layer 260. As a result, a portion of the second fin feature 230B is exposed in the second gate trench 310B.

Figure 7:
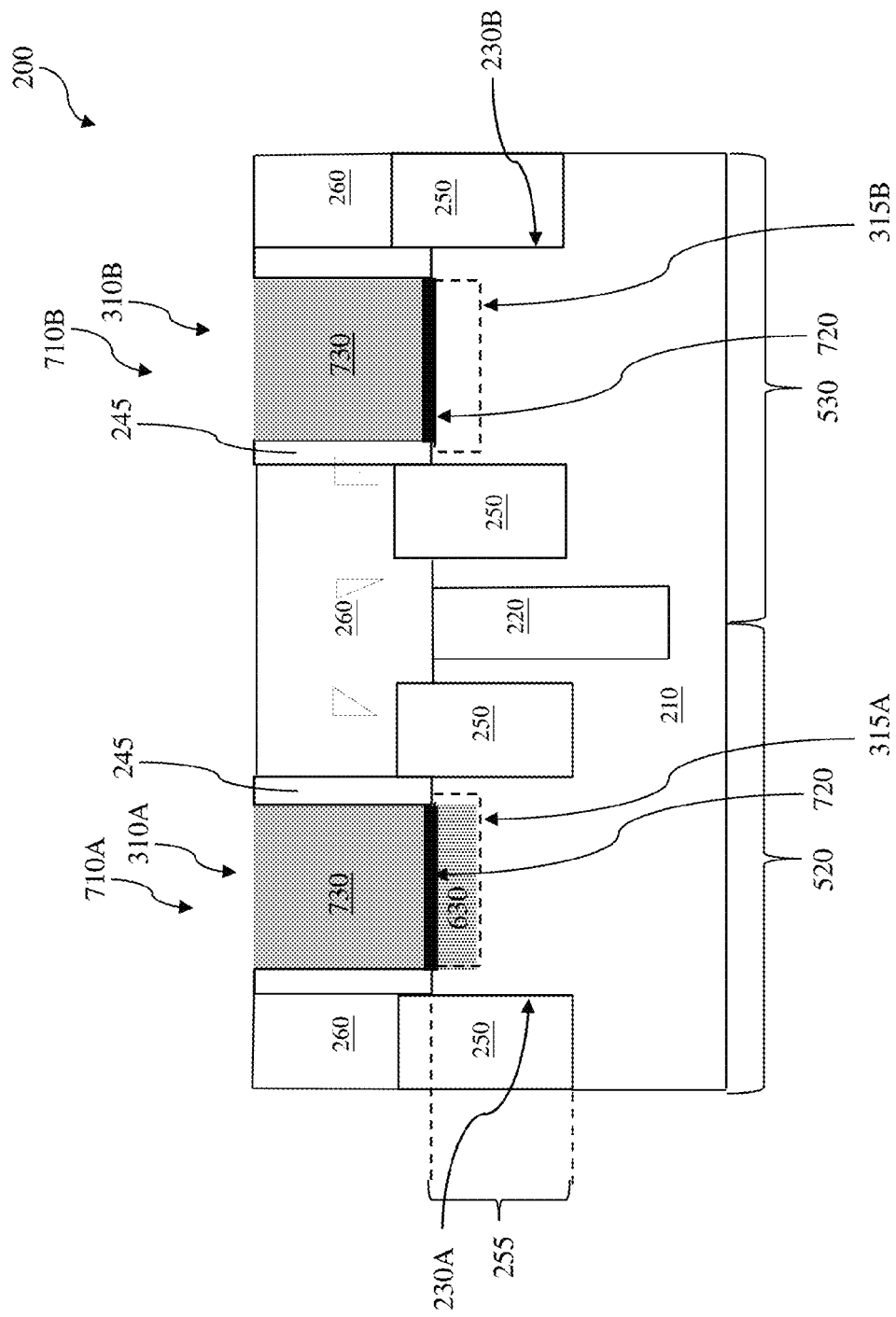

Referring to FIGS. 1 and 7, the method 100 proceeds to step 112 by forming HK/MG 710 in the first region 520 and the second region 530, including wrapping over the first fin feature 230A and the second fin feature 230B, respectively. For the sake of clarity to better description, the HK/MG 710 in the first region 520 is referred to as the first HK/MG 710A and the HK/MG 710 in the second region 530 is referred to as the second HK/MG 710B.

The first and second HK/MGs, 710A and 710B, include gate dielectric layer 720 and MG electrode 730 over the gate dielectric layer 720. In one embodiment, the gate dielectric layer 720 includes a dielectric material layer having a high dielectric constant (HK dielectric layer-greater than that of the thermal silicon oxide in the present embodiment) and the gate electrode 730 includes metal, metal alloy or metal silicide. The formation of the first and second HK/MGs, 710A and 710B, includes depositions to form various gate materials and a CMP process to remove the excessive gate materials and planarize the top surface of the semiconductor structure 200.

In one embodiment, the gate dielectric layer 720 includes an interfacial layer deposited by a suitable method, such as atomic layer deposition (ALD), CVD, thermal oxidation or ozone oxidation. The IL may include oxide, HfSiO and oxynitride. A HK dielectric layer is deposited on the IL by a suitable technique, such as ALD, CVD, metal-organic CVD (MOCVD), physical vapor deposition (PVD), other suitable technique, or a combination thereof. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The MG electrode 730 may include a single layer or alternatively a multi-layer structure, such as various combinations of a liner layer, wetting layer, adhesion layer and a conductive layer of metal, metal alloy or metal silicide. The MG electrode 730 may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode 730 may be formed by ALD, PVD, CVD, or other suitable process. In some embodiments, the MG electrode 730 may be formed at same time in both of the first and second regions, 520 and 530, with same metal layers. A CMP process may be performed to remove excessive MG electrode 730. The CMP process provides a substantially planar top surface for the MG electrode 730 and the ILD layer 260.

In the present embodiment, the first HK/MG 710A is formed over the first channel region 315A, which has the modified semiconductor material 630, and the second HK/MG 710B is formed over the second channel region 315B, which has a non-modified semiconductor material. Thus the first HK/MG 710A has a different threshold voltages Vt than the second HK/MG 710B. In the present embodiment, by choosing a material of the first and second fin features, 230A and 230B and the HPA process conditions together, two different target threshold voltages Vt for the first and second HK/MG, 710A and 710B, are achieved.

In some embodiments, the first HK/MG 710A and the second HK/MG 710B are formed simultaneously and have same gate dielectric layer 720 and the MG electrode 730. Alternatively, in some embodiment, the first HK/MG 710A and the second HM/MG 710B are formed individually and have different gate dielectric layer 720 and the MG electrode 730. By changing material properties in the first channel regions 310A, the first HK/MG 710A has a different threshold voltage Vt from the second HK/Mg 720. It proves process simplicity and flexibility for forming different threshold voltage Vt.

Additional steps can be provided before, during, and after the method 100, and some of the steps described can be replaced, eliminated, or moved around for additional embodiments of the method 100.

Figure 8:
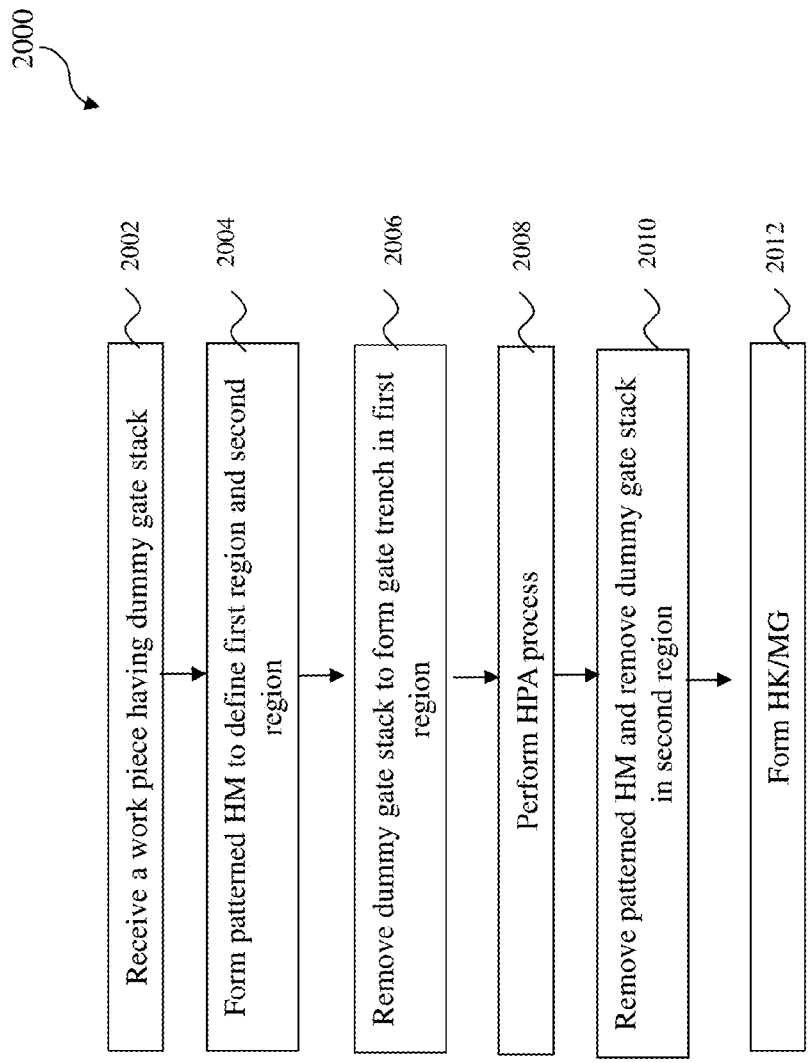
FIG. 8 is a flow chart of an example method for fabricating a semiconductor device in accordance with some embodiments.

FIG. 8 is a flowchart of another example method 2000 for fabricating the semiconductor device 200. The first step 2002 of the method 2000 is similar to step 102 of the method 100, discussed above in FIGS. 2A and 2B. Thus, the discussion above with respect to step 102 is applicable to step 2002. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 9:
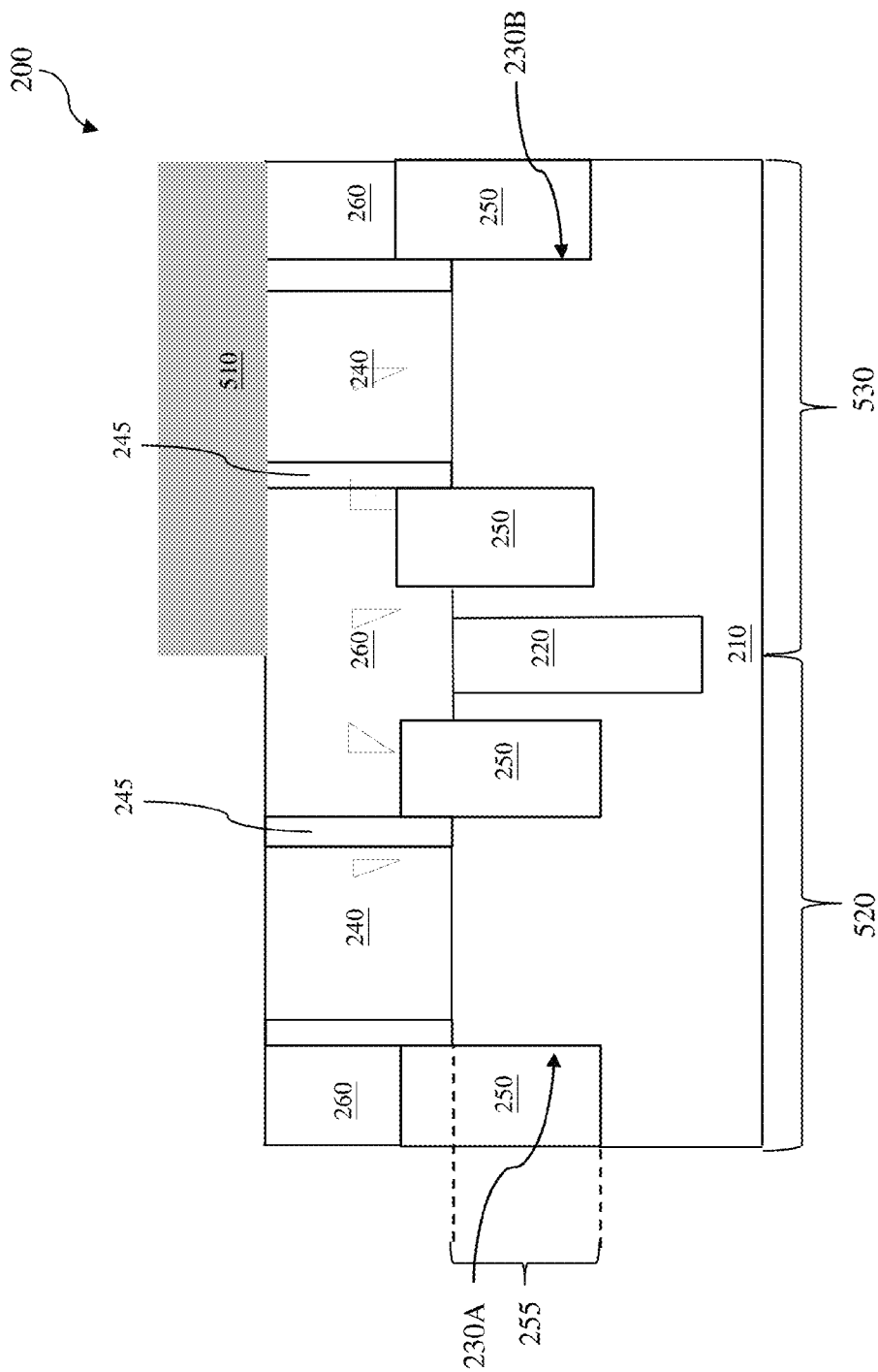
FIGS. 9, 10, 11 and 12 are cross-sectional views of an example semiconductor device along the line A-A in FIG. 2A, in accordance with some embodiments.

Referring to FIGS. 8 and 9, the method proceeds to step 2004 by forming the patterned HM 510 over the substrate 210, including over the second gate stack 240, to define the first region 520 and the second region 530. The formation of the patterned HM 510 is similarly in many respects to those discussed above in association with FIG. 4, including the materials discussed therein.

Figure 10:
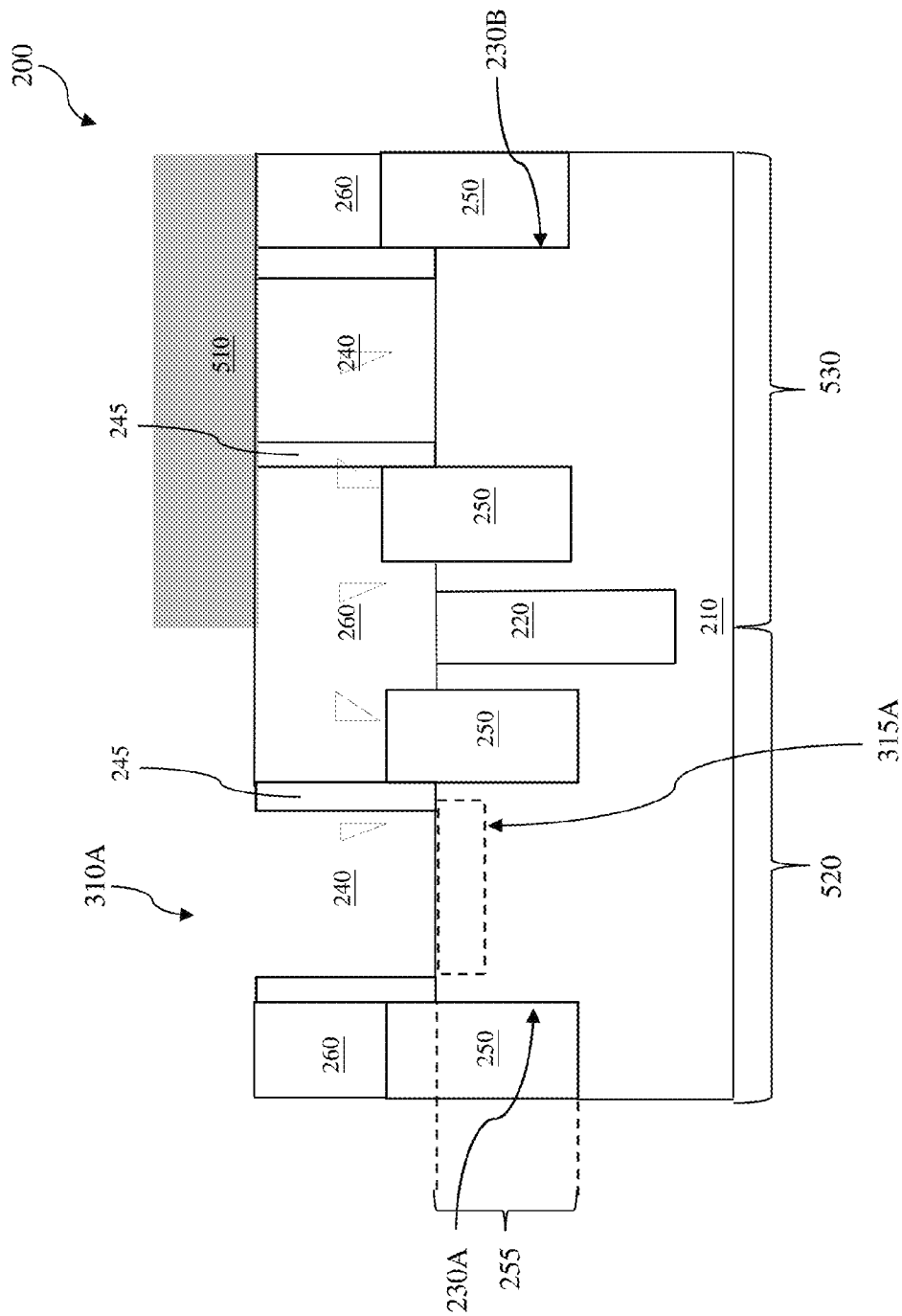

Referring to FIGS. 8 and 10, the method of 2000 proceeds to step 2006 by removing the dummy gate stack 240 and forming the first gate trench 310A in the first region 520. The removal of the dummy gate stack 240 is similarly in many respects to those discussed above in association with FIG. 3. The first channel region 315A is exposed in the first trench 310A.

Figure 11:
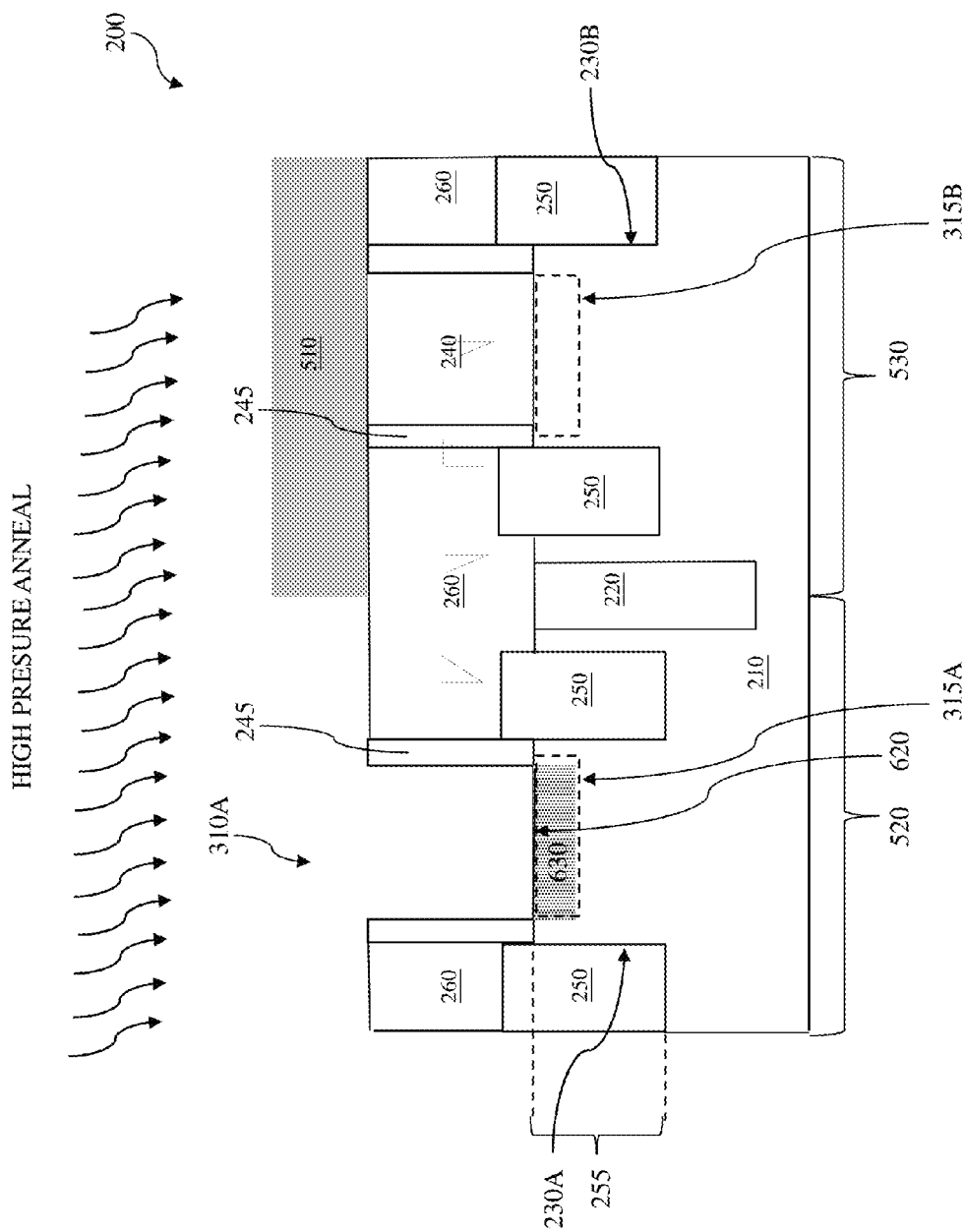

Referring to FIGS. 8 and 11, the method of 2000 proceeds to step 2008 by performing a HPA process to change material properties in the first channel region 315A. The HPA process is similarly in many respects to those discussed above in association with FIG. 6. During the HPA process, material properties of the semiconductor material in the upper portion (adjacent to the surface 620) of the first channel region 315A, such as interface defect density (Dit) and fixed charges, change to different material properties than the material properties in the second channel region 315B, referred to as the modified semiconductor material 630. In an embodiment, fixed charges and Dit are reduced in the first channel region 315A comparing to the second channel region 315B.

Figure 12:
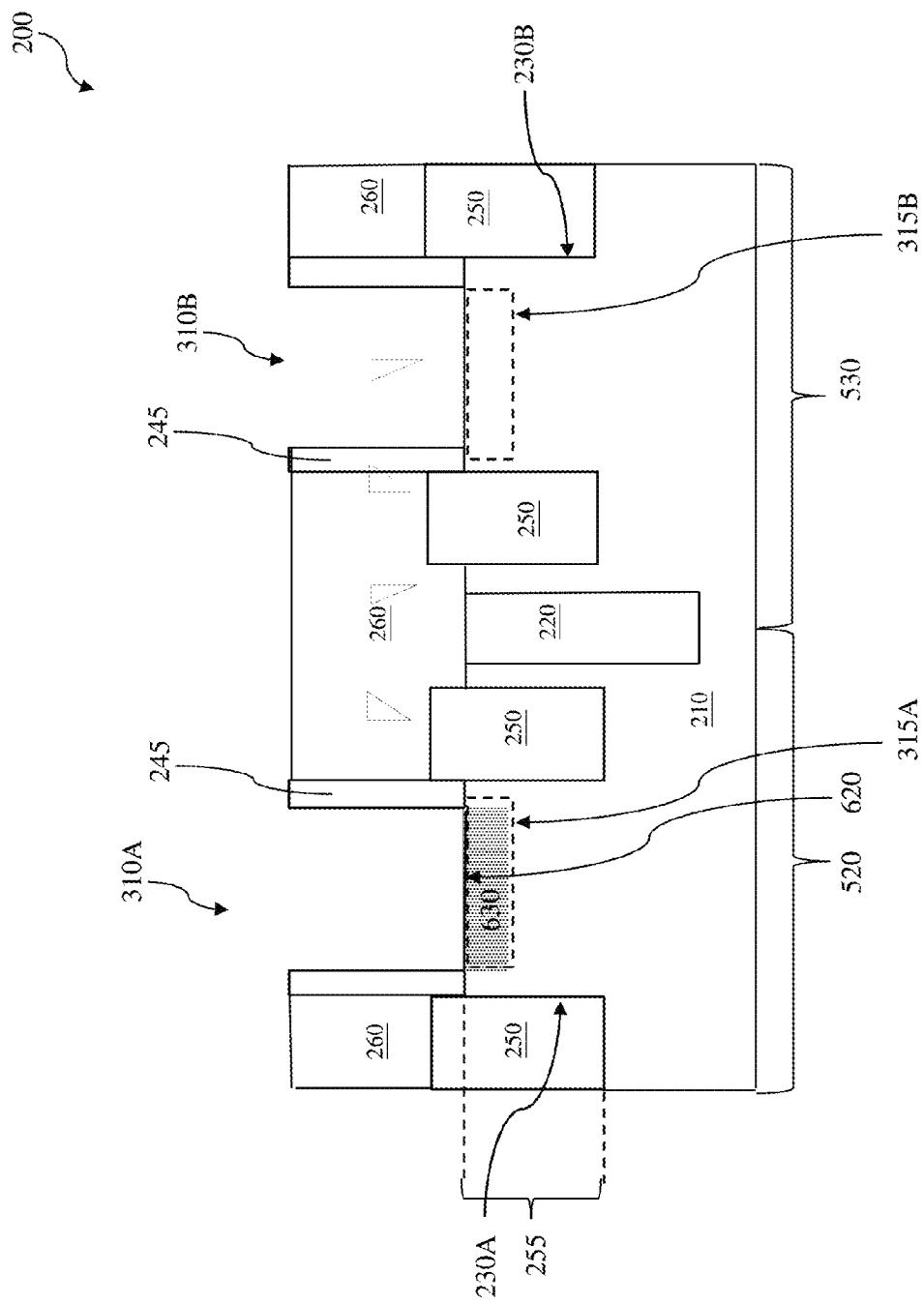

Referring to FIGS. 8 and 12, the method of 2000 proceeds to step 2010 by removing the patterned HM 510 and the dummy gate stack 240 and forming the second gate trench 310B in the second region 520. A portion of the second fin feature 230B (including the second channel region 315B) is exposed in the second gate trench 310B. The etching process may include wet etch, dry etch, and/or a combination thereof. The etching process may include a multiple sub-etching processes to achieve an adequate etch selectivity and process flexibility. In an embodiment, the patterned HM 510 is selectively removed without substantially etching the fin features 230A and 230B, the sidewall spacers 245 and the ILD layer 260. The removal of the dummy gate stack 240 is similarly in many respects to those discussed above in association with FIG. 3.

The remaining steps of method 2000 are similar to those described above with respect to FIG. 7. For simplicity and clarity, the remaining discussion of method 2000 refers to FIG. 7, including the materials discussed therein.

Additional steps can be provided before, during, and after the method 2000, and some of the steps described can be replaced, eliminated, or moved around for additional embodiments of the method 2000.

The semiconductor device 200 may undergo further CMOS or MOS technology processing to form various features and regions known in the art. For example, subsequent processing may form various contacts/vias/lines and multilayers interconnect features (e.g., metal layers and interlayer dielectrics) over the substrate 210, configured to connect the various features or structures of the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provides methods of forming different threshold voltages in a semiconductor device. Instead of adjusting threshold voltage by performing implantation, and/or forming different work function metal layer, and/or oxidizing a channel region, the methods provide forming different threshold voltages by performing a high-pressure-anneal process to change interface defect density (Dit) and fixed charges of a first channel region while leaving a second channel region intact. Thus threshold voltage adjustment is achieved without adverse impacts from an implantation process, process constrains from forming work function metal layer and non-uniform fin feature shape from an oxidation process. The method demonstrates a robust formation process for forming different threshold voltages.

The present disclosure provides many different embodiments of fabricating a semiconductor device that provide one or more improvements over existing approaches. In one embodiment, a method for fabricating a semiconductor device includes forming a first gate stack over a first fin feature and second gate stack over a second fin feature, removing the first gate stack to form a first gate trench that exposes the first fin structure, removing the second gate stack to form a second gate trench that exposes the second fin feature, performing a high-pressure-anneal (HPA) to a portion of the exposed first fin feature and forming a first high-k/metal gate (HK/MG) within the first gate trench over the portion of the first fin feature and a second HK/MG within the second gate trench over the second fin feature. Therefore the first HK/MG is formed with a first threshold voltage and the second HK/MG is formed with a second threshold voltage, which is different than the first threshold voltage.

In yet another embodiment, a method includes forming a first gate stack over a first fin feature and second gate stack over a second fin feature, removing the first gate stack to form a first gate trench that exposes the first fin structure, removing the second gate stack to form a second gate trench that exposes the second fin feature, performing a high-pressure-anneal (HPA) to the exposed first fin feature. The HPA is conducted in non-oxygen ambient. The method also includes forming a first high-k/metal gate (HK/MG) over the first portion of the fin feature and a second HK/MG over the second portion of the second fin feature. Therefore the first HK/MG is formed with a first threshold voltage and the second HK/MG is formed with a second threshold voltage, which is different than the first threshold voltage.

In yet another embodiment, a method includes forming a first gate stack over a first fin feature and second gate stack over a second fin feature, forming a hard mask over the second gate stack, removing the first gate stack to form a first gate trench that exposes the first fin structure, performing a high-pressure-anneal (HPA) to the exposed first fin feature. The HPA is conducted in non-oxygen ambient. The method also includes removing the hard mask, removing the second gate stack to form a second gate trench that exposes the first fin structure and forming a first high-k/metal gate (HK/MG) within the first gate trench over the portion of the first fin feature and a second HK/MG within the second gate trench over the second fin feature. The first HK/MG is formed with a first threshold voltage and the second HK/MG is formed with a second threshold voltage, which is different than the first threshold voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first gate stack over a first fin feature and a second gate stack over a second fin feature;
    removing the first gate stack to form a first gate trench that exposes a first channel region in the first fin structure;
    removing the second gate stack to form a second gate trench that exposes a second channel region in the second fin feature, the second channel region being formed of a semiconductor material;
    forming a hard mask (HM) layer within the second gate trench such that the HM layer physically contacts the semiconductor material of the second channel region without the HM layer being disposed within the first gate trench;
    performing a high-pressure-anneal (HPA) and changing a composition in the first channel region while the second channel region remains covered by the HM layer;
    removing the HM layer; and
    forming a first high-k/metal gate (HK/MG) within the first gate trench and a second HK/MG within the second gate trench.

2. The method of claim 1, wherein the HPA is conducted in non-oxygen ambient.

3. The method of claim 2, wherein HPA is conducted with a pressure range from about 10 atm to about 30 atm.

4. The method of claim 1, wherein the performing of the HPA and the changing of the composition in the first channel region includes: changing interface defect density (Dit) and fixed charges in a upper portion of the first channel region such that material properties in the upper portion of the first channel region are changed.

5. The method of claim 1, wherein the forming the first HK/MG and the second HK/MG results in the two HK/MGS having different threshold voltages.

6. The method of claim 1, wherein the performing of the HPA and the changing of the composition in the first channel region includes: changing material properties of the first channel region such that threshold voltage of the first channel is changed.

7. The method of claim 1, wherein HPA is conducted with process gases at least one process gas selected from the group consisting of hydrogen ($H_2$), deuterium ($D_2$), chlorine ($Cl_2$) and carbon tetrafluoride ($CF_4$).

8. The method of claim 1, wherein the removing of the HM layer includes selectively etching the hard mask layer without substantially etching the first fin feature and the second fin feature.

9. A method comprising:
    forming a first channel region in a first gate trench and a second channel region in a second gate trench, the second channel region being formed of a semiconductor material;
    forming a hard mask (HM) layer directly on the second channel region such that the HM layer physically contacts the semiconductor material of the second channel region;
    performing a high-pressure-anneal (HPA) and changing a composition-in the first channel region while the second channel region remains covered by the HM layer; and
    selectively removing the hard mask.

10. The method of claim 9, wherein the HPA is conducted with a pressure range from about 10 atm to about 30 atm.

11. The method of claim 9, further comprising forming a first high-k/metal gate (HK/MG) within the first gate trench and a second HK/MG within the second gate trench.

12. The method of claim 11, wherein the forming of first HK/MG and the second HM/MG includes forming the first and second channel regions with different threshold voltages.

13. The method of claim 9, wherein the HPA is conducted with process gases at least one process gas selected from the group consisting of hydrogen ($H_2$), deuterium ($D_2$), chlorine ($Cl_2$) and carbon tetrafluoride ($CF_4$).

14. A method comprising:
    forming a first gate stack over a first fin feature and a second gate stack over a second fin feature;
    removing the first gate stack to form a first gate trench that exposes a first channel region in the first fin structure and removing the second gate stack to form a second gate trench that exposes a second channel region in the second fin structure, the second channel region being formed of a semiconductor material;
    forming a hard mask (HM) layer over the second channel region such that the HM layer physically contacts the semiconductor material of the second channel region without the HM layer being disposed within the first gate trench;
    performing a high-pressure-anneal (HPA) and changing material properties in a upper portion of the first channel region such that a threshold voltage of the first channel region is changed;
    removing the hard mask layer; and
    forming a first high-k/metal gate (HK/MG) within the first gate trench and a second HK/MG within the second gate trench.

15. The method of claim 14, wherein the HPA is conducted with a pressure range from about 10 atm to about 30 atm.

16. The method of claim 14, wherein the first HK/MG and the second HK/MG are formed with different threshold voltages.

17. The method of claim 14, wherein the performing of the HPA and the changing of the composition in the first channel region includes: changing interface defect density (Dit) and fixed charges in a upper portion of the first channel region such that material properties in the first channel region are changed.

18. The method of claim 14, wherein the HPA is conducted with process gases at least one process gas selected from the group consisting of hydrogen ($H_2$), deuterium ($D_2$), chlorine ($Cl_2$) and carbon tetrafluoride ($CF_4$).

19. The method of claim 14, wherein the removing of the hard mask layer includes:
   selectively etching the hard mask layer without substantially etching the first fin feature and the second fin feature.

20. The method of claim 14, wherein the removing of the second gate stack to form a second gate trench includes:
   selectively etching the second gate stack without substantially etching the first fin feature and the second fin feature.

\* \* \* \* \*